(12) United States Patent
Mizoguchi

(10) Patent No.: US 9,958,671 B2
(45) Date of Patent: May 1, 2018

(54) OPTICAL SCANNER, MANUFACTURING METHOD OF OPTICAL SCANNER, IMAGE DISPLAY DEVICE, AND HEAD MOUNTED DISPLAY

(71) Applicant: Seiko Epson Corporation, Tokyo (JP)

(72) Inventor: Yasushi Mizoguchi, Suwa (JP)

(73) Assignee: Seiko Epson Corporation (JP)

( * ) Notice: Subject to any disclaimer, the term of this patent is extended or adjusted under 35 U.S.C. 154(b) by 0 days. days.

(21) Appl. No.: 15/228,470

(22) Filed: Aug. 4, 2016

(65) Prior Publication Data
US 2017/0038578 A1 Feb. 9, 2017

(30) Foreign Application Priority Data
Aug. 5, 2015 (JP) .................................. 2015-155307

(51) Int. Cl.
| | |
|---|---|
| *G02B 26/08* | (2006.01) |
| *G02B 26/10* | (2006.01) |
| *G02B 27/01* | (2006.01) |
| *B81B 3/00* | (2006.01) |
| *G02B 27/10* | (2006.01) |

(52) U.S. Cl.
CPC .............. *G02B 26/101* (2013.01); *B81B 3/00* (2013.01); *G02B 27/0149* (2013.01); *G02B 27/0176* (2013.01); *G02B 27/104* (2013.01); *G02B 2027/0178* (2013.01)

(58) Field of Classification Search
CPC .. G02B 26/10; G02B 26/101; G02B 27/0149; G02B 27/0176; G02B 27/104; G02B 26/0841; G02B 26/085; G02B 27/017; G02B 2027/0178; B82Y 20/00; B81B 3/00
USPC ....................................................... 359/214.1
See application file for complete search history.

(56) References Cited

U.S. PATENT DOCUMENTS 6,408,123 B1 * 6/2002 Kuroda ................. B82Y 20/00
359/368
2009/0080049 A1 3/2009 Ko et al.

FOREIGN PATENT DOCUMENTS

| JP | 3483567 B2 | 1/2004 |
|---|---|---|
| JP | 2009-075587 A | 4/2009 |
| JP | 2009-216938 A | 9/2009 |
| WO | WO-95-24652 A1 | 9/1995 |

\* cited by examiner

*Primary Examiner* — Euncha Cherry
(74) *Attorney, Agent, or Firm* — Harness, Dickey & Pierce, P.L.C.

(57) ABSTRACT

An optical scanner includes a first Si layer, a second Si layer, and an $SiO_2$ layer present between the Si layers. The optical scanner includes a movable section and shaft sections formed from the first Si layer, a holding section formed from the second Si layer and disposed to be separated from the movable section, a coupling section formed from the $SiO_2$ layer and configured to couple the movable section and the holding section, and a light reflecting section provided on the upper surface of the holding section and configured to reflect light. The movable section and the coupling section are joined by direct joining.

20 Claims, 12 Drawing Sheets

OPTICAL SCANNER, MANUFACTURING METHOD OF OPTICAL SCANNER, IMAGE DISPLAY DEVICE, AND HEAD MOUNTED DISPLAY

BACKGROUND

1. Technical Field

The present invention relates to an optical scanner, a manufacturing method of the optical scanner, an image display device, and a head mounted display.

2. Related Art

For example, JP-A-2009-75587 (Patent Literature 1) discloses an optical scanner that two-dimensionally scans light. The optical scanner disclosed in Patent Literature 1 includes a frame, a frame-like outer driving section capable of swinging around a first axis with respect to the frame, an inner driving section provided on the inner side of the outer driving section and capable of swinging around a second axis orthogonal to the first axis with respect to the outer driving section, and a stage fixed to the inner driving section via a coupling beam and having a mirror surface. It is possible to two-dimensionally scan light reflected on the mirror surface by swinging the inner driving section around the second axis while swinging the outer driving section around the first axis.

However, in the configuration disclosed in Patent Literature 1, the stage and the coupling beam have to be joined using a fixing material such an adhesive. Therefore, joining strength of the stage is insufficient.

SUMMARY

An advantage of some aspects of the invention is to provide an optical scanner having high bonding strength and having excellent mechanical strength, a manufacturing method of the optical scanner, an image display device, and a head mounted display.

The advantage can be achieved by the following configuration.

An optical scanner according to an aspect of the invention includes: a first Si layer; a first $SiO_2$ layer; a second Si layer, the first Si layer, the first $SiO_2$ layer, and the second Si layer being formed in a layer structure in which the first Si layer, the first $SiO_2$ layer, and the second Si layer are stacked in this order, the second Si layer including a movable section and a shaft section configured to support the movable section to be capable of swinging around a swing axis, the first Si layer including a holding section, and the first $SiO_2$ layer including a coupling section configured to couple the movable section and the holding section; and a light reflecting section provided on a surface side opposite to a surface of the holding section on which the coupling section is provided, the light reflecting section reflecting light. The movable section and the coupling section are joined by direct joining.

With this configuration, it is possible to increase joining strength of the movable section and the coupling section. The optical scanner has excellent mechanical strength.

In the optical scanner according to the aspect of the invention, it is preferable that the holding section overlaps at least a part of the shaft section in a plan view from the plate thickness direction of the movable section.

With this configuration, it is possible to increase the holding section in size. Therefore, it is possible to increase the light reflecting section in size.

In the optical scanner according to the aspect of the invention, it is preferable that the optical scanner includes a first portion provided on the surface of the holding section on which the coupling section is provided, the first portion being formed from the first $SiO_2$ layer, and the first portion includes a groove section in a region overlapping the shaft section in a plan view from the plate thickness direction of the movable section.

With this configuration, it is possible to reinforce the holding section with the first portion.

In the optical scanner according to the aspect of the invention, it is preferable that the optical scanner includes: a second $SiO_2$ layer provided on the opposite side of a surface of the first Si layer on which the first $SiO_2$ layer is provided; and a second portion provided between the holding section and the light reflecting section and formed from the second $SiO_2$ layer.

With this configuration, it is possible to reinforce the holding section with the second portion. It is possible to reduce a bend of a reinforcing section due to thermal expansion by holding the reinforcing section between the first portion and the second portion made of the same material.

In the optical scanner according to the aspect of the invention, it is preferable that the optical scanner includes a supporting section formed from the second Si layer and configured to support the shaft section.

With this configuration, it is possible to support the movable section via the shaft section.

In the optical scanner according to the aspect of the invention, it is preferable that the optical scanner includes a supporting section structure formed from the first Si layer, provided to surround at least a part of the holding section in a plan view from the plate thickness direction of the holding section, and joined to the supporting section.

With this configuration, it is possible to reinforce the supporting section with the supporting section structure.

In the optical scanner according to the aspect of the invention, it is preferable that a reflection reducing film that reduces reflection of the light is provided on a surface on the opposite side of a surface of the supporting section structure on which the supporting section is provided.

With this configuration, it is possible to reduce stray light.

In the optical scanner according to the aspect of the invention, it is preferable that a clearance between the holding section and the supporting section structure is smaller than a clearance between the movable section and the supporting section.

With this configuration, it is possible to more effectively reduce the stray light.

A manufacturing method of an optical scanner according to another aspect of the invention is a manufacturing method of an optical scanner including: a movable section, a shaft section configured to support the movable section to be capable of swinging around a swing axis, a holding section disposed to be separated from the movable section in the thickness direction of the movable section, a coupling section located between the movable section and the holding section and configured to couple the movable section and the holding section, and a light reflecting section provided on a surface side opposite to a surface of the holding section on which the movable section is provided, the light reflecting section reflecting light, the manufacturing method including: preparing a first substrate on which a first Si layer and a first $SiO_2$ layer are stacked and forming the coupling section from the first $SiO_2$ layer; preparing a second substrate including a second Si layer and directly joining the coupling section of the first substrate and the second Si layer of the second substrate; patterning, from a surface side opposite to a surface on which the first substrate is provided, the second Si layer to form the movable section and the shaft section; patterning, from a surface side opposite to a surface on which the second substrate is provided, the first Si layer to form the holding section; and disposing the light reflecting section in the holding section.

With this configuration, it is possible to increase joining strength of the movable section and the coupling section. The optical scanner has excellent mechanical strength.

In the manufacturing method of the optical scanner according to the aspect of the invention, it is preferable that the first substrate includes a second $SiO_2$ layer provided on a surface on the opposite side of a surface of the first Si layer on which the first $SiO_2$ layer is provided, and the forming the holding section includes patterning the first Si layer via a mask formed from the second $SiO_2$ layer.

With this configuration, it is easy to form the holding section.

A manufacturing method of an optical scanner according to still another aspect of the invention is a manufacturing method of an optical scanner including: a movable section, a shaft section configured to support the movable section to be capable of swinging around a swing axis, a holding section disposed to be separated from the movable section in the thickness direction of the movable section, a coupling section located between the movable section and the holding section and configured to couple the movable section and the holding section, and a light reflecting section provided on the opposite side of a surface of the holding section on which the coupling section is provided, the light reflecting section reflecting light, the manufacturing method including: preparing an SOI substrate including a first Si layer, a second Si layer, and a first $SiO_2$ layer provided between the first Si layer and the second Si layer, the coupling section being formed from the first SiO2 layer; patterning, from a surface side opposite to a surface on which the first Si layer is provided, the second Si layer to form the movable section and the shaft section; patterning, from a surface side opposite to a surface on which the second Si layer is provided, the first Si layer to form the holding section; and disposing the light reflecting section in the holding section.

With this configuration, it is possible to increase joining strength of the movable section and the coupling section. The optical scanner has excellent mechanical strength.

An image display device according to yet another aspect of the invention includes the optical scanner according to the aspect of the invention.

With this configuration, it is possible to obtain the image display device having high reliability.

A head mounted display according to still yet another aspect of the invention includes: the optical scanner according to the aspect of the invention; and a frame mounted with the optical scanner and worn on the head of an observer.

With this configuration, it is possible to obtain the head mounted display having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of an optical scanner, a manufacturing method of the optical scanner, an image display device, and a head mounted display according to the invention are explained below with reference to the accompanying drawings.

First Embodiment

First, an image display device according to a first embodiment of the invention is explained.

Figure 1:
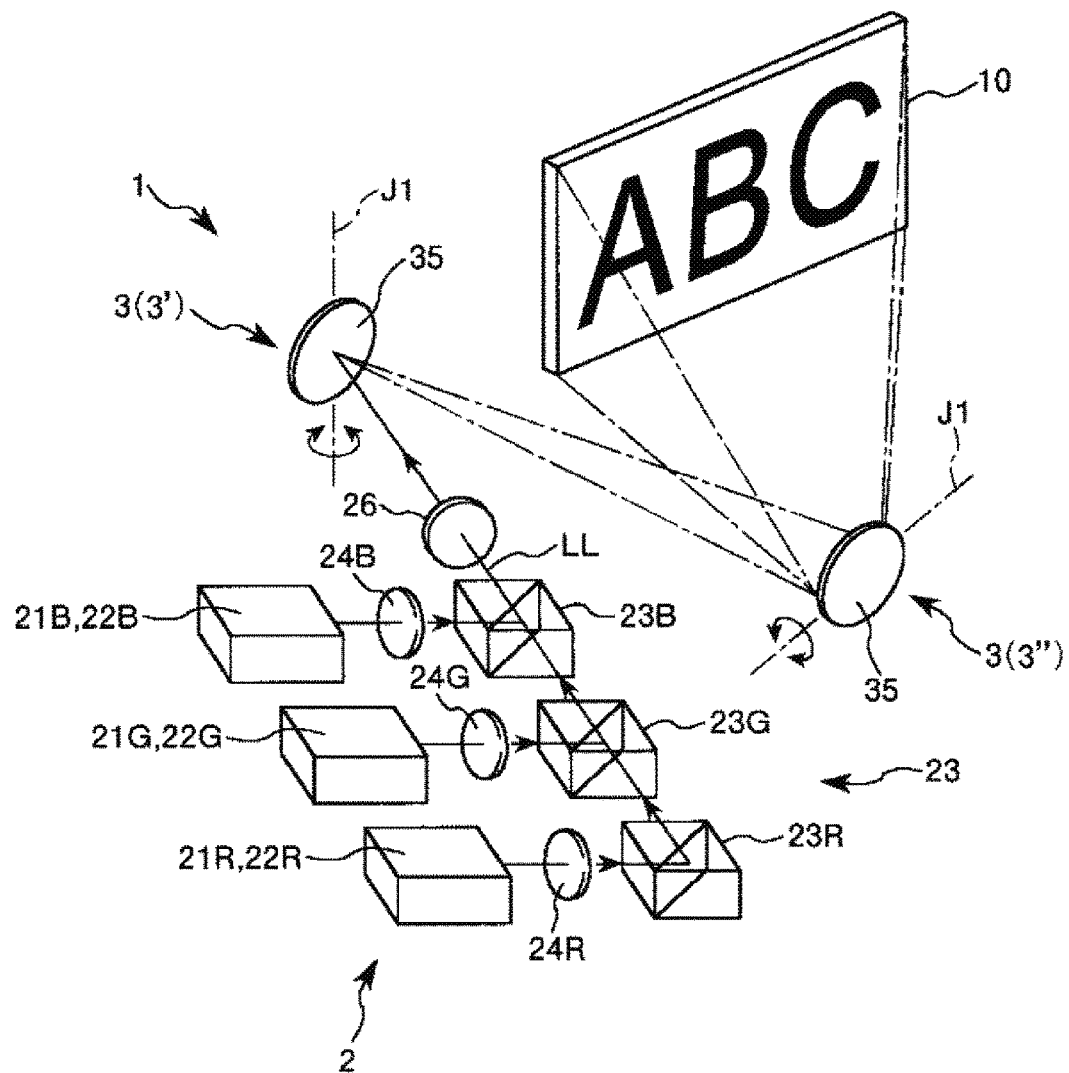
FIG. 1 is a configuration diagram of an image display device according to a first embodiment of the invention.
Figure 2:
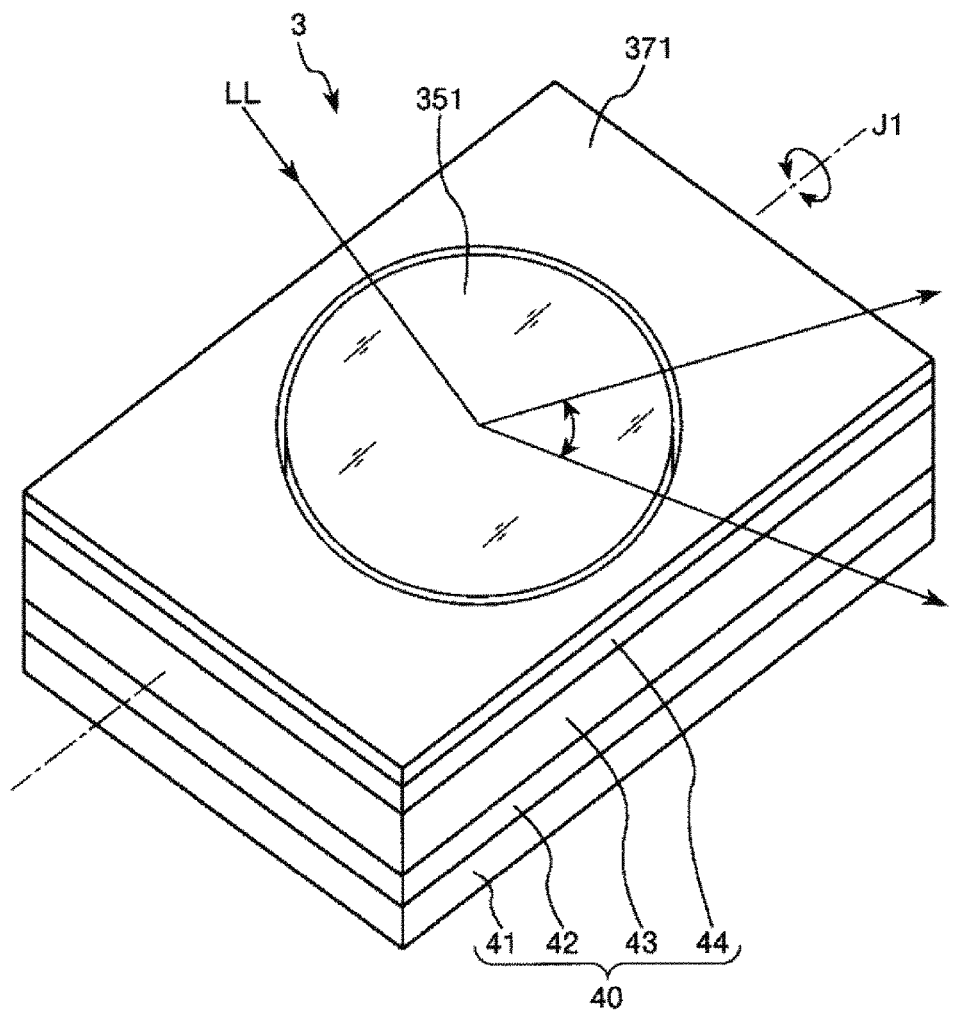
FIG. 2 is a perspective view of an optical scanner included in the image display device shown in FIG. 1.
Figure 3:
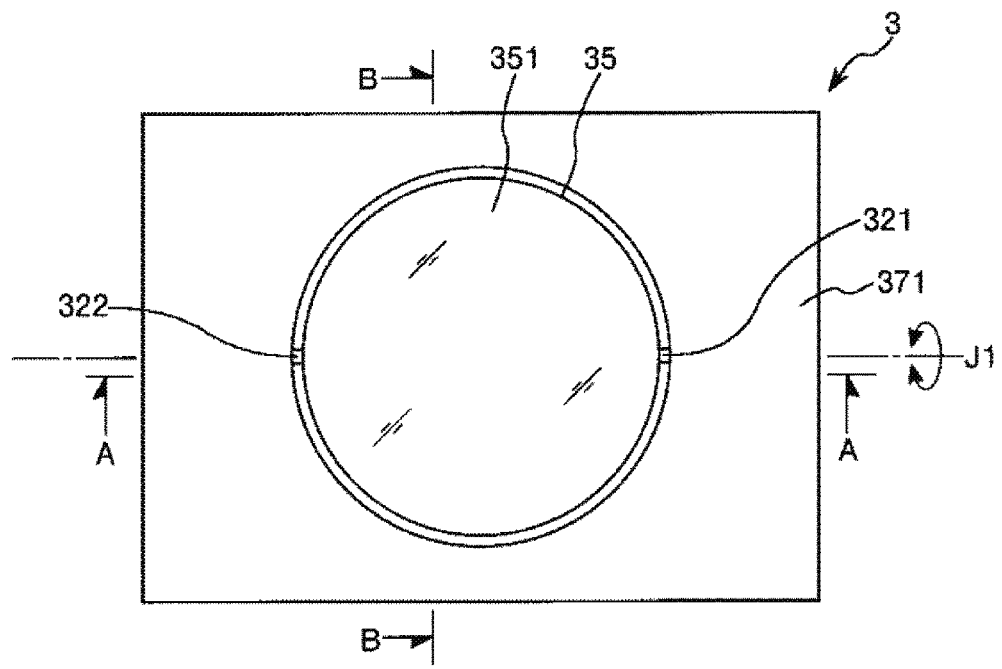
FIG. 3 is a top view of the optical scanner.
Figure 4:
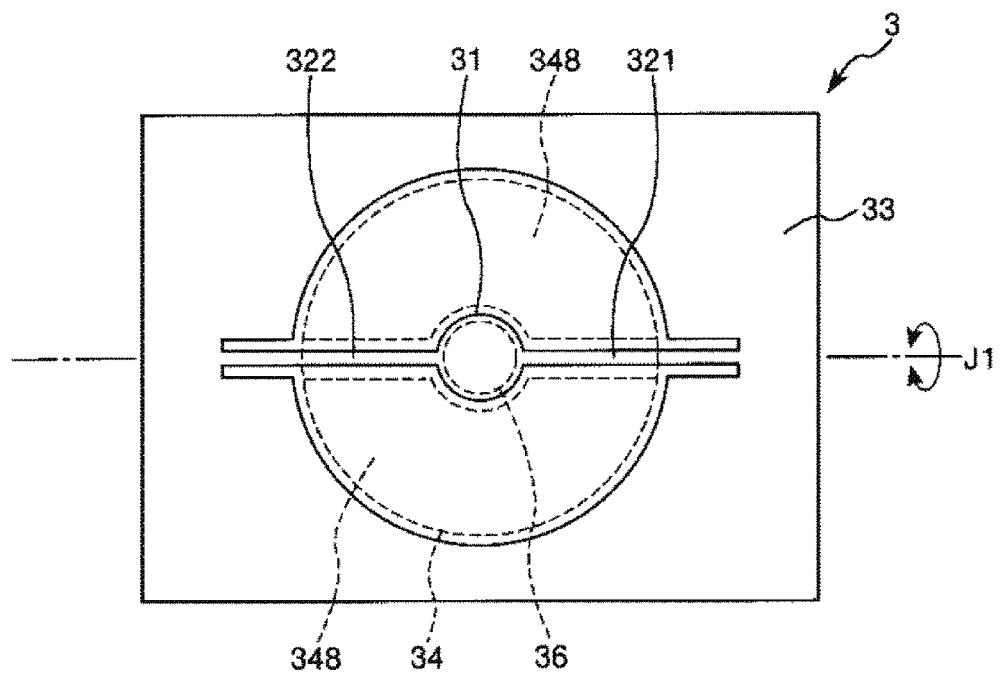
FIG. 4 is a partially omitted top view of the optical scanner.
Figure 5:
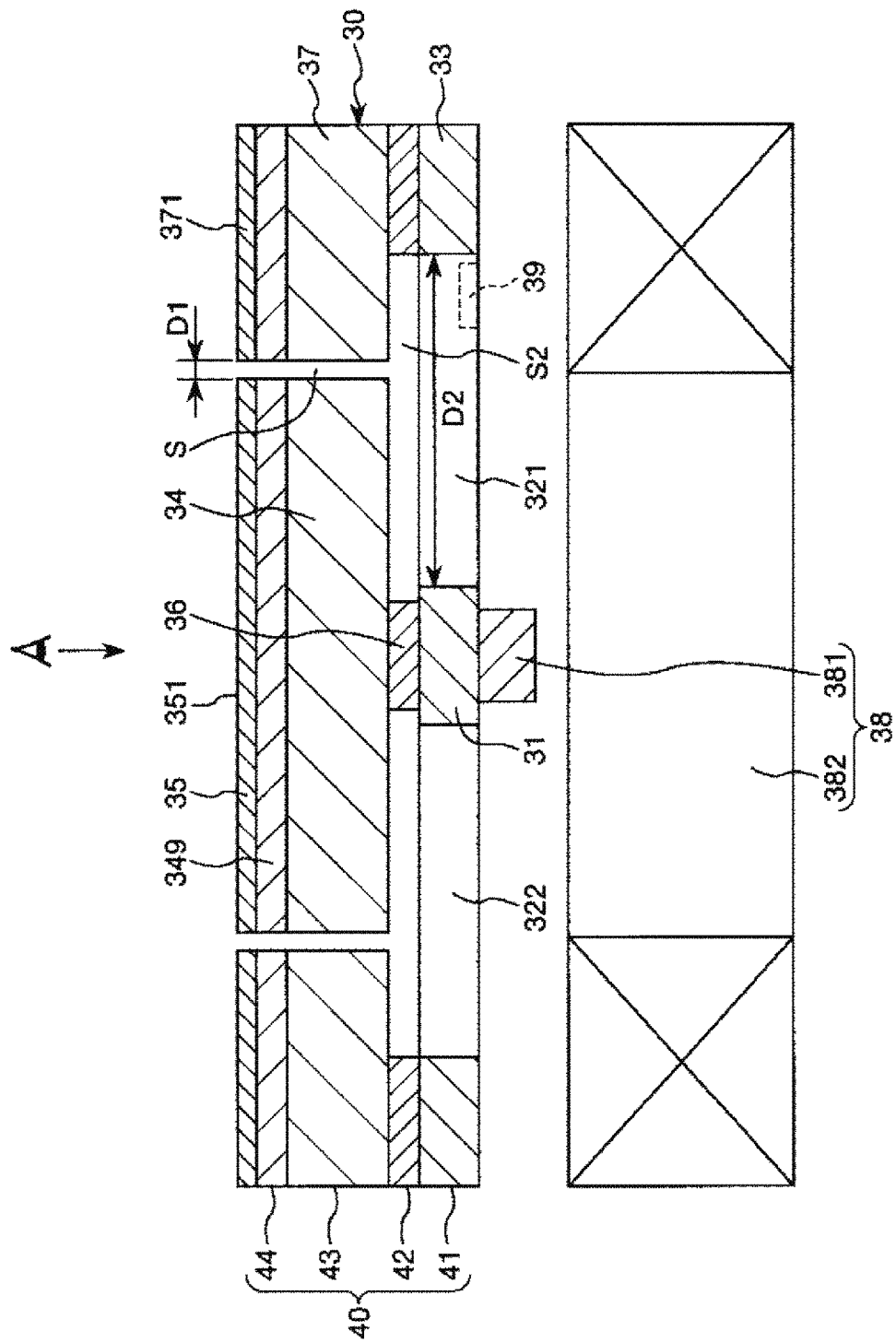
FIG. 5 is a sectional view taken along line A-A in FIG. 3.
Figure 6:
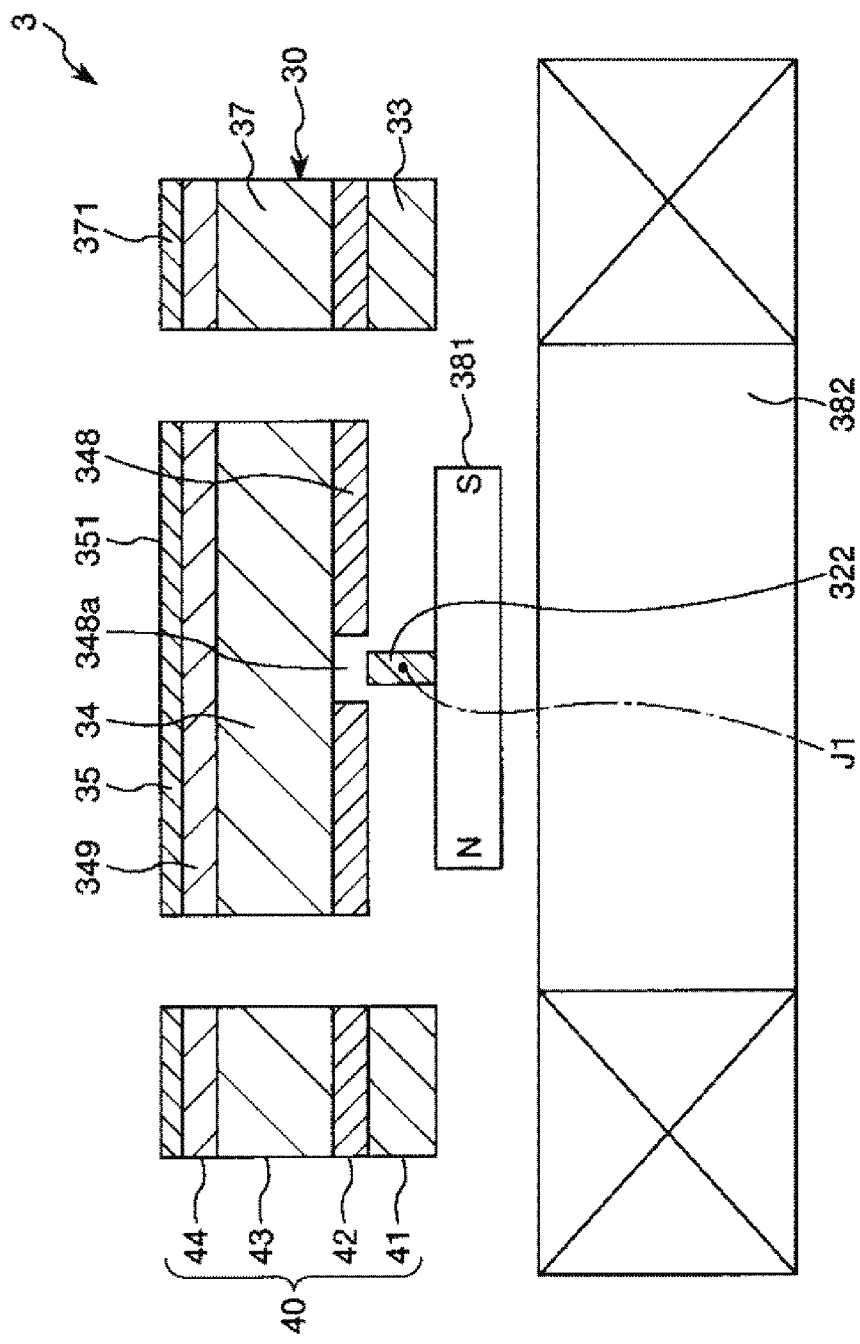
FIG. 6 is a sectional view taken along line B-B in FIG. 3.
Figure 7:
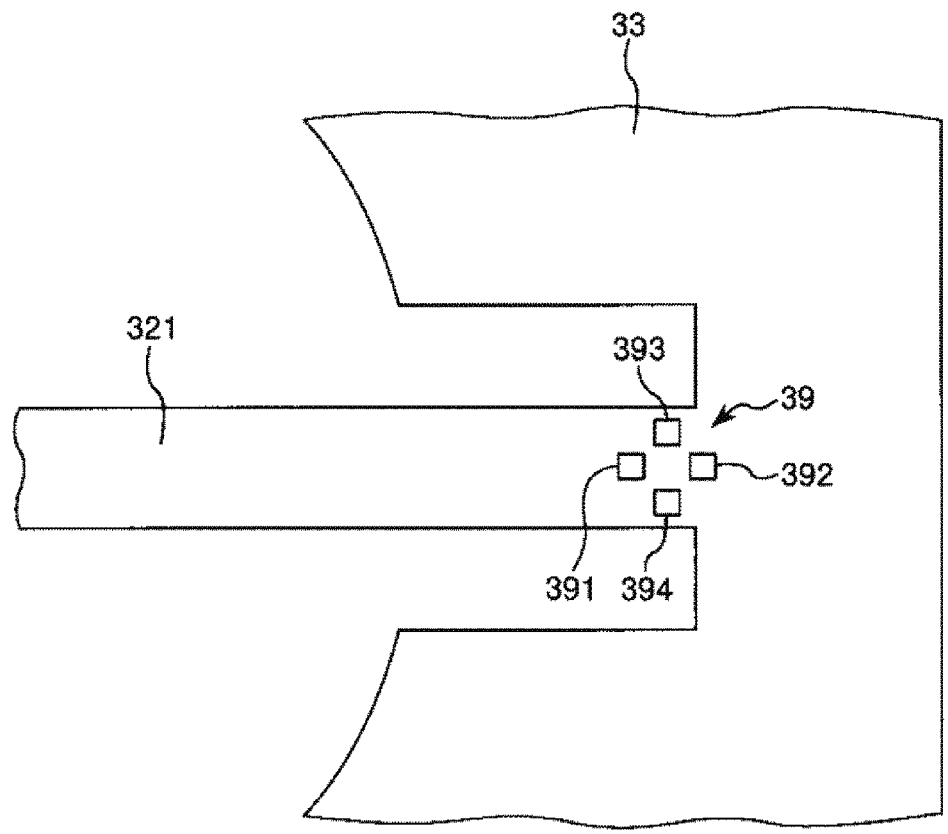
FIG. 7 is a plan view showing a sensor section included in the optical scanner.
Figure 8:
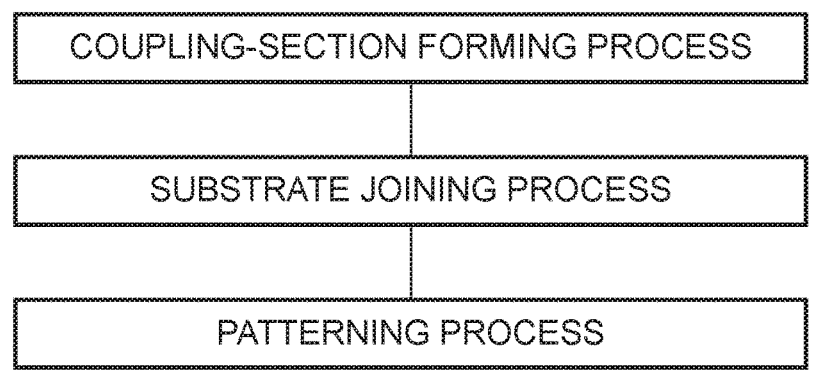
FIG. 8 is a flowchart for explaining a manufacturing method of the optical scanner.

FIG. 1 is a configuration diagram of an image display device according to a first embodiment of the invention. FIG. 2 is a perspective view of an optical scanner included in the image display device shown in FIG. 1. FIG. 3 is a top view of the optical scanner. FIG. 4 is a partially omitted top view of the optical scanner. FIG. 5 is a sectional view taken along line A-A in FIG. 3. FIG. 6 is a sectional view taken along line B-B in FIG. 3. FIG. 7 a plan view showing a sensor section included in the optical scanner. FIG. 8 is a flowchart for explaining a manufacturing method of the optical scanner. FIGS. 9 to 17 are respectively sectional views for explaining the manufacturing method of the optical scanner. Note that, in the following explanation, for convenience of explanation, the upper side in FIG. 5 is referred to as "upper" as well and a lower side in FIG. 5 is referred to as "lower" as well.

An image display device 1 shown in FIG. 1 is a device that two-dimensionally scans a laser LL for drawing on a target object 10 such as a screen or a wall surface to display an image.

The image display device 1 includes a light source unit 2 that emits the laser LL for drawing and two optical scanners 3 that scan the laser LL emitted from the light source unit 2. The two optical scanners 3 are disposed such that scanning directions (axes J1 explained below) are orthogonal. For example, one optical scanner 3 scans the laser LL in the horizontal direction and the other optical scanner 3 scans the laser LL in the vertical direction after scanning the laser LL in the horizontal direction to display a two-dimensional image on the target object 10.

Note that, in the following explanation, the optical scanner 3 that scans the laser LL in the horizontal direction is referred to as "optical scanner for horizontal scanning 3'" as well and the optical scanner 3 that scans the laser LL in the vertical direction is referred to as "optical scanner for vertical scanning 3''" as well.

Light Source Unit

The light source unit 2 includes, as shown in FIG. 1, a light source section including laser beam sources 21R, 21G, and 21B for respective colors of red, green, and blue, driving circuits 22R, 22G, and 22B that drive the laser beam sources 21R, 21G, and 21B, collimator lenses 24R, 24G, and 24B that collimate laser beams emitted from the laser beam sources 21R, 21G, and 21B, a light combining section 23, and a condensing lens 26.

The laser beam source 21R emits red light. The laser beam source 21G emits green light. The laser beam source 21B emits blue light. By using the three color lights, it is possible to display a full-color image. Note that the laser beam sources 21R, 21G, and 21B are not particularly limited. However, for example, a laser diode, an LED, and the like can be used.

The driving circuit 22R drives the laser beam source 21R. The driving circuit 22G drives the laser beam source 21G. The driving circuit 22B drives the laser beam source 21B. The driving by the driving circuits 22R, 22G, and 22B is independently controlled by a not-shown control section. The three laser beams emitted from the laser beam sources 21R, 21G, and 21B driven by the driving circuits 22R, 22G, and 22B are respectively collimated by the collimator lenses 24R, 24G, and 24B and made incident on the light combining section 23.

The light combining section 23 combines the lights from the laser beam sources 21R, 21G, and 21B. The light combining section 23 includes three dichroic mirrors 23R, 23G, and 23B. The dichroic mirror 23R has a function of reflecting the red light. The dichroic mirror 23G has a function of transmitting the red light and reflecting the green light. The dichroic mirror 23B has a function of transmitting the red light and the green light and reflecting the blue light.

By using the dichroic mirrors 23R, 23G, and 23B, it is possible to combine the three color laser beams of the red light, the green light, and the blue light from the laser beam sources 21R, 21G, and 21B. The intensities of the lights emitted from the laser beam sources 21R, 21G, and 21B are respectively independently modulated by the control section, whereby the laser LL (light) for drawing having a predetermined color is generated. After the numerical aperture of the laser LL generated in this way is changed to a desired NA (numerical aperture) by the condensing lens 26, the laser LL is led to the optical scanner 3.

The light source unit 2 is explained above. However, the configuration of the light source unit 2 is not limited to the configuration in this embodiment as long as the light source unit 2 can generate the laser LL.

Optical Scanner

The optical scanner 3 includes, as shown in FIG. 2, a light reflection surface 351 capable of swinging around an axis (a swing axis) J1. The optical scanner 3 reflects the laser LL on the light reflection surface 351 to scan the laser LL. The optical scanner 3 is explained in detail below. Note that, in the following explanation, a plan view viewed from the normal direction of the light reflection surface 351 in a stationary state (an arrow direction in FIG. 5) is simply referred to as "plan view" as well.

The optical scanner 3 includes, as shown in FIGS. 2 to 5, a structure 30 including a movable section 31, shaft sections 321 and 322 that support the movable section 31 to be capable of swinging (turning) around the axis J1, a supporting section 33 that supports the shaft sections 321 and 322, a holding section 34 disposed on the upper surface side of the movable section 31 to be separated from the movable section 31, a light reflecting section 35 held by the holding section 34, a coupling section 36 disposed between the movable section 31 and the holding section 34 to couple the movable section 31 and the holding section 34, and a supporting section structure 37 disposed around the holding section 34, a driving section 38 that swings the movable section 31 around the axis J1, and a sensor section 39 that detects a swing angle (a tilt) around the axis J1 of the movable section 31.

The movable section 31 is formed in a tabular shape. The shape in a plan view of the movable section 31 is not particularly limited. However, in this embodiment, the shape is a circular shape.

The shaft sections 321 and 322 are disposed on opposite sides each other with respect to the movable section 31. The shaft sections 321 and 322 respectively extend along the axis J1. One end portions of the shaft sections 321 and 322 are connected to the movable section 31 and the other end portions are connected to the supporting section 33. The shaft sections 321 and 322 support the movable section 31 to be capable of swinging around the axis J1. The shaft sections 321 and 322 are twisted and deformed according to the swinging of the movable section 31 around the axis J1. Note that the shape of the shaft sections 321 and 322 is not limited to the shape in this embodiment as long as the shaft sections 321 and 322 can support the movable section 31 to be capable of swinging around the axis J1.

The supporting section 33 is formed in a frame shape and disposed to surround the movable section 31 and the shaft sections 321 and 322 in a plan view of the movable section 31 (the light reflecting section 35). In other words, the movable section 31 and the shaft sections 321 and 322 are disposed on the inner side of the supporting section 33. The supporting section 33 is connected to the shaft sections 321 and 322 and supports the shaft sections 321 and 322. By providing the supporting section 33, it is possible to stably support the movable section 31. It is possible to smoothly swing the movable section 31 around the axis J1. Note that the shape of the supporting section 33 is not particularly limited. For example, a portion for supporting the shaft section 321 and a portion for supporting the shaft section 322 may be separated. The supporting section 33 may be formed thicker than the movable section 31 and the shaft sections 321 and 322.

As shown in FIG. 5, the holding section 34 is separated from the movable section 31 and the shaft sections 321 and 322 in the plate thickness direction. As shown in FIG. 4, the holding section 34 is provided to overlap a part of the shaft sections 321 and 322 in plan view. The holding section 34 has a function of holding the light reflecting section 35.

As shown in FIG. 5, the light reflecting section 35 is located on the upper surface side of the holding section 34 (a surface side on the opposite side of a surface on which the coupling section 36 is provided) and held by the holding section 34 (in this embodiment, the light reflecting section 35 is held by the holding section 34 via an upper layer 349). The light reflecting section 35 has light reflectivity. The surface of the light reflecting section 35 is formed as the light reflection surface 351 that reflects the laser LL. Therefore, the laser LL made incident on the light reflection surface 351 is reflected on the light reflection surface 351 and scanned in a direction corresponding to the posture of the light reflection surface 351. The light reflecting section 35 can be formed of a metal film of aluminum or the like.

Since the holding section 34 is provided and the light reflecting section 35 is disposed in the holding section 34 in this way, it is possible to exhibit effects explained below. When the configuration explained above is adopted, since it is unnecessary to provide the light reflecting section 35 in the movable section 31, it is possible to reduce the movable section 31 in size. Accordingly, it is possible to reduce the distance between the shaft sections 321 and 322. Therefore, it is possible to reduce the optical scanner 3 in size. Since the holding section 34 shifts in the plate thickness direction with respect to (is separated in the plate thickness direction from) the shaft sections 321 and 322, it is possible to increase the holding section 34 in size without hindering the twisting deformation of the shaft sections 321 and 322. Therefore, it is possible to increase the light reflection surface 351 in size. Since the holding section 34 is provided in this way, it is possible to achieve a reduction in the size of the optical scanner 3 while increasing the light reflection surface 351 in size.

As shown in FIG. 6, on the lower surface (a surface on which the coupling section 36 is provided) of the holding section 34, a lower layer (a first portion) 348 is provided to exclude a joining region to the coupling section 36. The lower layer 348 functions as, for example, a reinforcing section that reinforces the mechanical strength of the holding section 34. In a region overlapping the shaft sections 321 and 322 in plan view on the lower surface (a surface on the movable section 31 side) of the lower layer 348, a groove section (a through-hole) 348a recessed to the holding section 34 side is provided. The groove section 348a functions as an escape section for preventing contact with the shaft sections 321 and 322. By providing the lower layer 348 in this way, it is possible increase the mechanical strength of the holding section 34 without hindering smooth driving of the optical scanner 3.

Note that, although the groove section 348a recessed to the holding section 34 side is a through-hole, the groove section 348a only has to be capable of preventing contact of the shaft sections 321 and 322 and the lower layer 348. The thickness of the lower layer 348 may be reduced. The lower layer 348 is provided to exclude the joining region to the coupling section 36. However, contact of the shaft sections 321 and 322 and the lower layer 348 only has to be able to be prevented. The lower layer 348 and the coupling section 36 may be connected in apart. Note that, when the groove section 348a is a through-hole, the bottom surface of the groove section 348a is formed as an Si layer 43 that configures the holding section 34.

As shown in FIGS. 5 and 6, the upper layer (a second portion) 349 is provided on the upper surface of the holding section 34. That is, the upper layer 349 is located between the holding section 34 and the light reflecting section 35 and is provided to sandwich the holding section 34 between the upper layer 349 and the lower layer 348. The upper layer 349 functions as, for example, a reinforcing section that reinforces the mechanical strength of the holding section 34. As explained below concerning a manufacturing method, the upper layer 349 also functions as a mask in patterning the holding section 34.

The upper layer 349 is desirably formed of a material same as the material of the lower layer 348. In other words, the movable section 31, the coupling section 36, and the holding section 34 form a stacked structure in this order. Consequently, coefficients of thermal expansion (coefficients of liner expansion) of the lower layer 348 and the upper layer 349 are equalized. By sandwiching the holding section 34 between the lower layer 348 and the upper layer 349, it is possible to effectively reduce a bend and a warp of the holding section 34 during thermal expansion. Therefore, a bend and a warp of the light reflection surface 351 are also reduced. It is possible to exhibit an excellent light scanning property. Further, the upper layer 349 desirably has thickness substantially the same as the thickness of the lower layer 348. Consequently, the effects are more conspicuous. Note that, in this embodiment, as explained below, the upper layer 349 and the lower layer 348 are formed of $SiO_2$.

As shown in FIG. 5, the coupling section 36 is formed in a columnar shape and disposed between the movable section 31 and the holding section 34. The movable section 31 and the holding section 34 are coupled via the coupling section 36. In particular, in the optical scanner 3, as explained below concerning the manufacturing method, the coupling section 36 and the movable section 31 are joined by direct joining. Consequently, for example, compared with when the coupling section 36 and the movable section 31 are joined using an adhesive, it is possible to increase joining strength of the coupling section 36 and the movable section 31. Therefore, the optical scanner 3 is excellent in mechanical strength.

As shown in FIGS. 5 and 6, the supporting section structure 37 is disposed to surround the circumference of the holding section 34 and joined to the supporting section 33. The supporting section structure 37 has a function of a reinforcing section that reinforces the mechanical strength of the supporting section 33. On the upper surface (a surface on the opposite side of the supporting section 33) of the supporting section structure 37, a reflection preventing film (a reflection reducing film) 371 that reduces reflection of the laser LL is provided. Therefore, it is possible to prevent a part of the laser LL from being reflected on the supporting section structure 37 to be stray light. Note that the reflection preventing film 371 is not particularly limited. However, for example, a Cr film and a black resist can be used.

In particular, in this embodiment, as shown in FIGS. 5 and 6, the upper surface of the supporting section structure 37 is substantially flush with the upper surface of the upper layer 349 (i.e., located in the same plane). Therefore, the laser LL is less easily made incident on the side surfaces of the holding section 34 and the supporting section structure 37. It is possible to effectively suppress stray light that occurs when the laser LL is reflected on the side surfaces of the holding section 34 and the supporting section structure 37.

Further, in plan view, a clearance D1 between the holding section 34 and the supporting section structure 37 and a clearance D2 between the movable section 31 and the supporting section 33 satisfy a relation D1<D2. When the relation is satisfied, it is possible to reduce a gap S between the holding section 34 and the supporting section structure 37. The laser LL is less easily made incident on the shaft sections 321 and 322 via the gap S. Therefore, it is possible to effectively suppress stray light that occurs when the laser LL is reflected on the shaft sections 321 and 322. Even if the laser LL is reflected on the shaft sections 321 and 322 to be stray light when the gap S is reduced, it is possible to effectively confine the stray light in a space S2 between the holding section 34/the supporting section structure 37 and the shaft sections 321 and 322.

The structure 30 is explained above. However, as shown in FIGS. 5 and 6, the structure 30 (excluding the light reflecting section 35 and the reflection preventing film 371) is formed by patterning a stacked body 40 in which an Si layer (a second Si layer) 41, an $SiO_2$ layer (a first $SiO_2$ layer) 42, an Si layer (a first Si layer) 43, and an $SiO_2$ layer (a second $SiO_2$ layer) 44 are stacked in order from the lower side.

Specifically, the movable section 31, the shaft sections 321 and 322, and the supporting section 33 are formed from the Si layer 41. The holding section 34 is formed from the Si layer 43. The coupling section 36 and the lower layer 348 are formed from the $SiO_2$ layer 42. The upper layer 349 is formed from the $SiO_2$ layer 44. The supporting section structure 37 is formed from the $SiO_2$ layer 42, the Si layer 43, and the $SiO_2$ layer 44. By formed the structure 30 from the stacked body 40 in this way, it is possible to more easily and accurately form the structure 30.

The driving section 38 includes, as shown in FIGS. 5 and 6, a permanent magnet 381 provided on the lower surface of the movable section 31 and a coil 382 disposed to be opposed to the permanent magnet 381 to generate a magnetic field acting on the permanent magnet 381. The permanent magnet 381 is disposed such that, in plan view, an S pole is located on one side of the axis J1 and an N pole is located on the other side. As such a permanent magnet 381, for example, a neodymium magnet, a ferrite magnet, a samarium cobalt magnet, an alnico magnet, and a bond magnet can be suitably used. In the driving section 38, it is possible to swing the movable section 31 (the light reflecting section 35) around the axis J1 by applying an alternating voltage to the coil 382.

Concerning the optical scanner for horizontal scanning 3' of the two optical scanners 3, the movable section 31 is desirably swung by resonant driving. Consequently, it is possible to increase a swing angle of the movable section 31 around the axis J1. Note that the frequency of the resonant driving is not particularly limited. However, the frequency of the resonant driving is desirably, for example, approximately 10 to 40 kHz. On the other hand, concerning the optical scanner for vertical scanning 3", the movable section 31 is desirably swung by non-resonant driving. The frequency of the non-resonant driving is not particularly limited. However, the frequency of the non-resonant driving is desirably, for example, approximately 30 to 120 Hz (approximately 60 Hz).

The sensor section 39 is provided in a connecting section to the supporting section 33 on the lower surface of the shaft section 321. Since the sensor section 39 is provided on the lower surface of the shaft section 321 (on the opposite side of the supporting section structure 37), it is easy to form the sensor section 39.

The sensor section 39 includes, as shown in FIG. 7, a bridge circuit including four piezoelectric resistance sections 391, 392, 393, and 394. Signals corresponding to resistance values of the piezoelectric resistance sections 391, 392, 393, and 394 that change according to twisting deformation of the shaft section 321 are output from the bridge circuit. It is possible to detect a twisting amount of the shaft section 321 from the output. Further, it is possible to detect a swing angle around the axis J1 of the movable section 31 from the twisting amount of the shaft section 321. The piezoelectric resistance sections 391, 392, 393, and 394 can be formed by doping (diffusing or injecting) impurities to Si such as phosphorus or boron into the Si layer 41. Note that, in the example explained above, the bridge circuit is formed by the four piezoelectric resistance sections as the sensor section 39. However, the sensor section 39 only has to be capable of detecting a twisting amount and is not limited to this configuration.

The structure of the optical scanner 3 is explained above.

A manufacturing method of the optical scanner 3 (the structure 30) is explained with reference to FIGS. 8 to 17. The manufacturing method of the optical scanner 3 (the structure 30) includes, as shown in FIG. 8, a coupling-section forming process, a substrate joining process, and a patterning process.

Coupling-Section Forming Process

Figure 9:
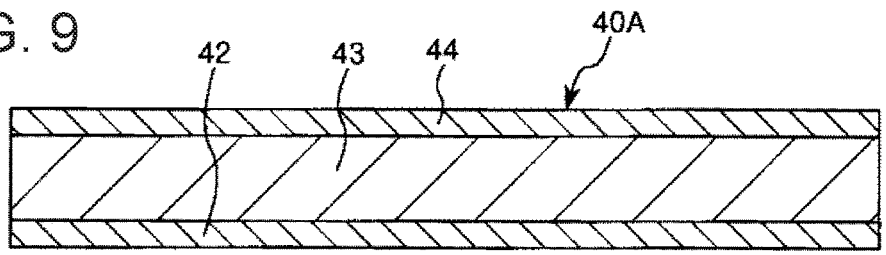
FIG. 9 is a sectional views for explaining the manufacturing method of the optical scanner.

First, as shown in FIG. 9, a first substrate 40A is prepared in which the $SiO_2$ layer (the first $SiO_2$ layer) 42, the Si layer (the first Si layer) 43, and the $SiO_2$ layer (the second $SiO_2$ layer) 44 are stacked in this order (step 1). Note that, as the first substrate 40A, it is possible to use, for example, a substrate obtained by preparing a substrate formed from the Si layer 43 and thermally oxidizing both surfaces of the Si layer 43 to form the $SiO_2$ layers 42 and 44.

Figure 10:
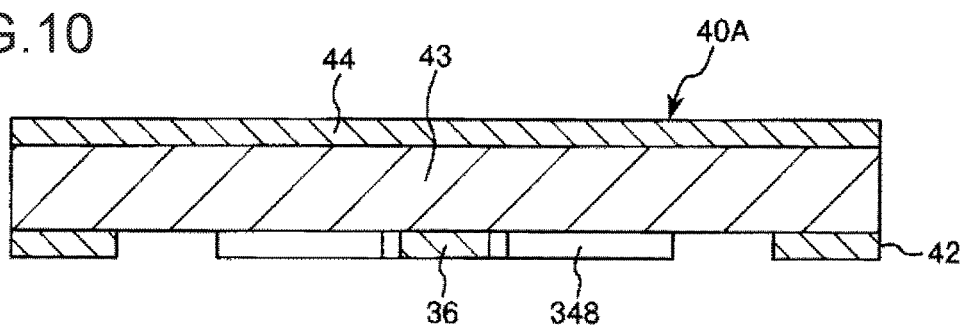
FIG. 10 is a sectional views for explaining the manufacturing method of the optical scanner.
Figure 11:
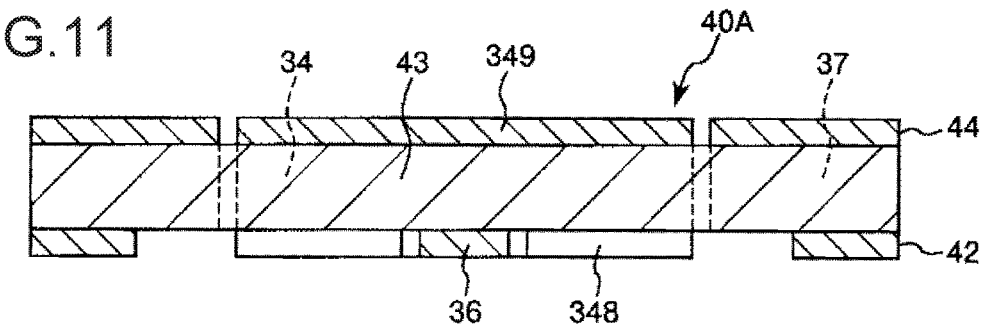
FIG. 11 is a sectional views for explaining the manufacturing method of the optical scanner.
Figure 12:
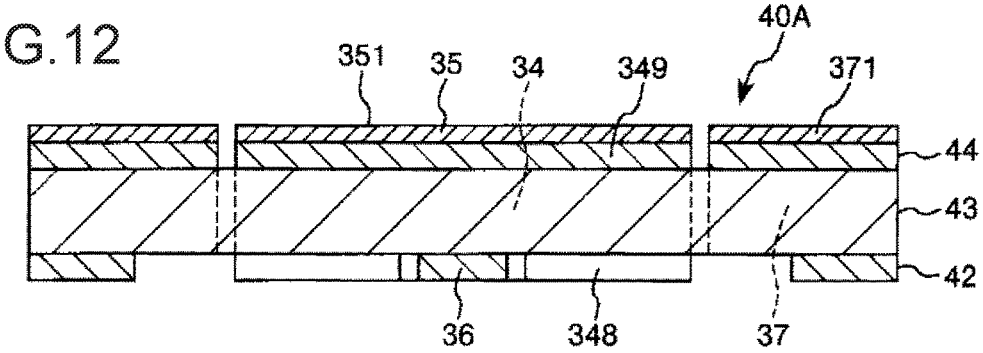
FIG. 12 is a sectional views for explaining the manufacturing method of the optical scanner.

Subsequently, as shown in FIG. 10, the $SiO_2$ layer 42 is patterned by etching (wet etching, dry etching, etc.) to form the coupling section 36 and the lower layer 348 (step 2). Subsequently, as shown in FIG. 11, the $SiO_2$ layer 44 is patterned by etching to form a part of the upper layer 349 and the supporting section structure 37 (step 3). Subsequently, as shown in FIG. 12, an Al film is formed on the upper layer 349 to form the light reflecting section 35 and a Cr film is formed on the supporting section structure 37 to form the reflection preventing film 371 (step 4).

Note that the order of step 2 and step 3 is not particularly limited. For example, step 2 and step 3 may be performed in the opposite order or may be simultaneously performed. The order of step 4 is not limited to this. For example, step 4 may be performed later than in this embodiment (e.g., during or after the substrate joining process or during or after the patterning process).

In the coupling-section forming process, the Si layer 43 is not patterned in order to prevent the first substrate 40A (the holding section 34 and the supporting section structure 37) from being divided into pieces by patterning the Si layer 43. Consequently, it is possible to smoothly perform the later processes.

Substrate Joining Step

Figure 13:
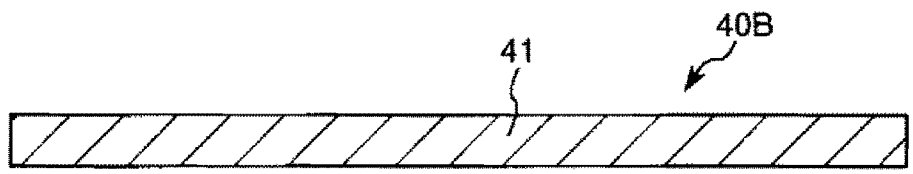
FIG. 13 is a sectional views for explaining the manufacturing method of the optical scanner.

First, as shown in FIG. 13, a second substrate 40B formed from the Si layer 41 is prepared (step 5).

Figure 14:
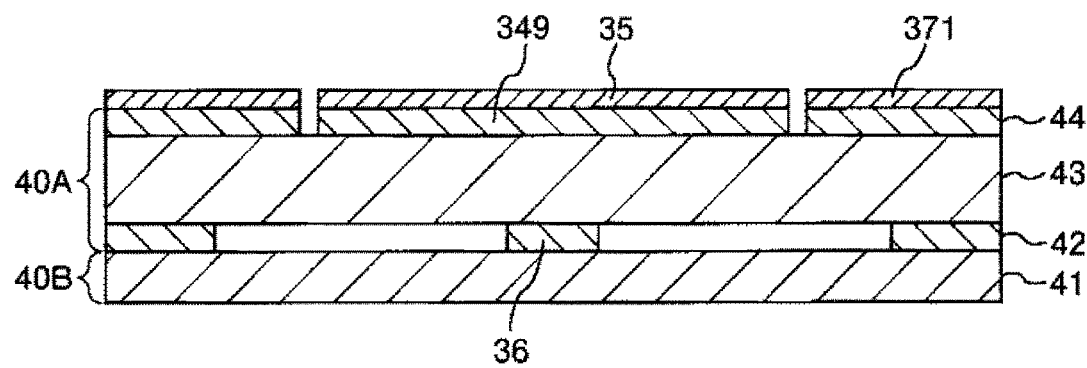
FIG. 14 is a sectional views for explaining the manufacturing method of the optical scanner.

Subsequently, as shown in FIG. 14, the first substrate 40A and the second substrate 40B are superimposed such that the Si layer 41 and the $SiO_2$ layer 42 are in contact. The first substrate 40A and the second substrate 40B are heated to be directly joined (step 6). The direct joining means that the Si layer 41 and the $SiO_2$ layer 42 are bonded by covalent bonding of (—Si—O—Si—).

A process for performing the direct joining is, for example, as explained below. First, cleaning and surface treatment of the first substrate 40A and the second substrate 40B are performed using a chemical such as acid and pure water. A large number of hydroxyl groups are formed on the surfaces of the first substrate 40A and the second substrate 40B by the surface treatment. Subsequently, the surfaces of the first substrate 40A and the second substrate 40B subjected to hydrophilic treatment are superimposed and joined. The joining at this point occurs because the surfaces of the first substrate 40A and the second substrate 40B attract each other. The joining at this stage is weak because the joining is formed by hydrogen bonding between the hydroxyl groups on the surfaces of the first substrate 40A and the second substrate 40B. Subsequently, heat treatment is performed at approximately 1000° C. in order to bond the Si layer 41 and the $SiO_2$ layer 42 through the covalent bonding. Consequently, the direct joining is completed.

Prior to the direct joining, the surface of the Si layer 41 is desirably activated by plasma irradiation. Consequently, it is possible to use plasma surface activation joining. It is possible to reduce a heating temperature (e.g., approximately 200° C.). Therefore, it is possible to reduce breakage of the first and second substrates 40A and 40B.

Figure 15:
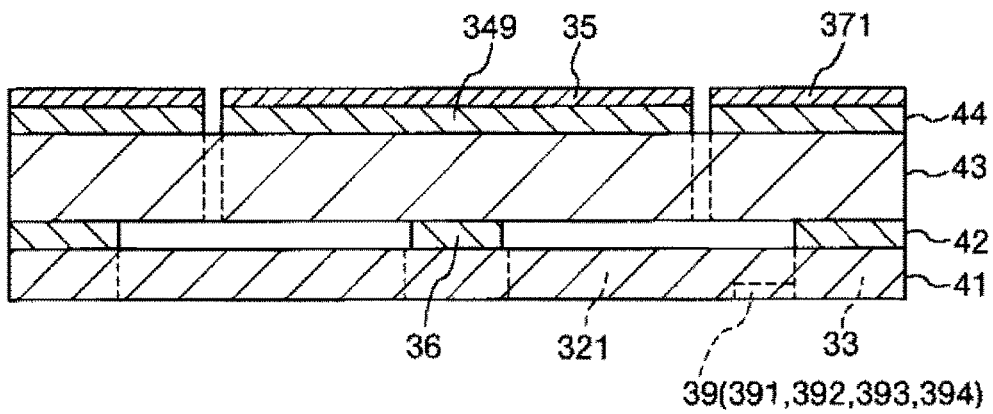
FIG. 15 is a sectional views for explaining the manufacturing method of the optical scanner.

Subsequently, as shown in FIG. 15, phosphorus, boron, or the like is doped into a portion corresponding to a connecting section of the shaft section 321 to the supporting section 33 on the lower surface of the Si layer 41 to form the piezoelectric resistance sections 391, 392, 393, and 394 and provide the sensor section 39 (step 7). Note that the order of step 7 is not particularly limited. For example, step 7may be performed prior to step 6 or may be performed later than in this embodiment.

Patterning Process

Figure 16:
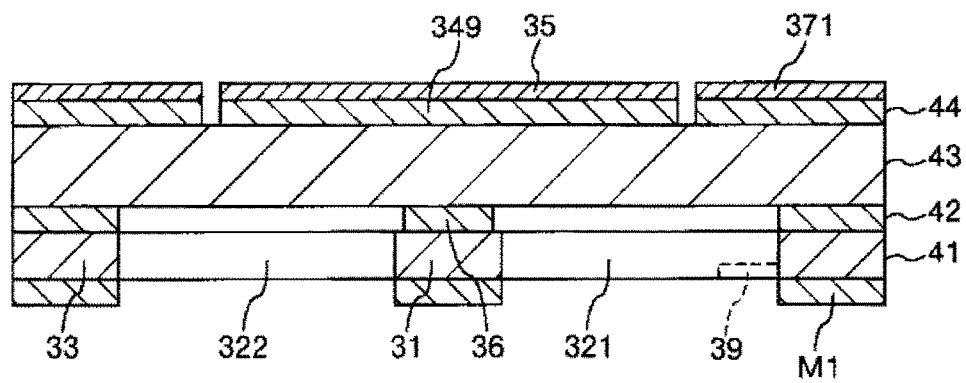
FIG. 16 is a sectional views for explaining the manufacturing method of the optical scanner.

First, as shown in FIG. 16, masks M1 corresponding to plan view shapes of the movable section 31, the shaft sections 321 and 322, and the supporting section 33 are formed on the lower surface of the Si layer 41. The Si layer 41 is patterned by etching via the masks M1 (i.e., from a surface opposite to a surface on which the first substrate 40A is provided) (step 8). Consequently, the movable section 31, the shaft sections 321 and 322, and the supporting section 33 are formed from the Si layer 41.

Figure 17:
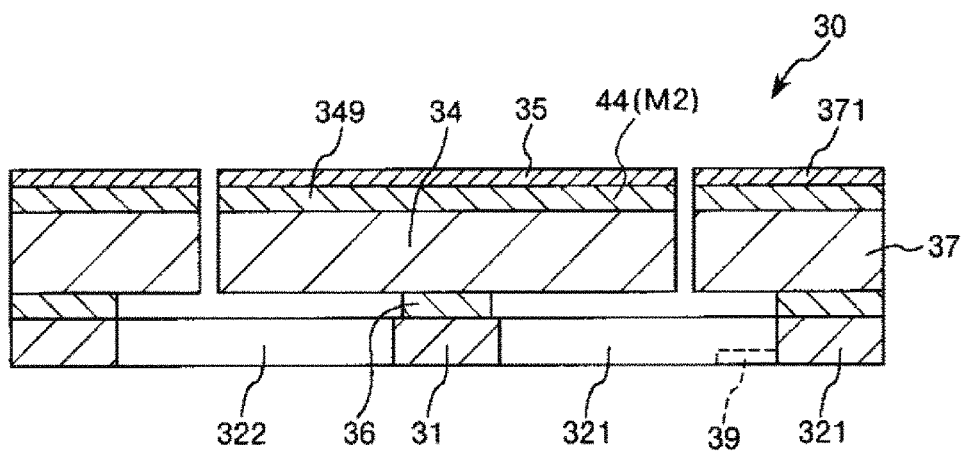
FIG. 17 is a sectional views for explaining the manufacturing method of the optical scanner.

Subsequently, as shown in FIG. 17, using the $SiO_2$ layer 44 as a mask M2, the Si layer 43 is patterned by etching via the mask M2 (the $SiO_2$ layer 44) (i.e., from a surface opposite to a surface on which the second substrate 40B is provided) (step 9). Consequently, the holding section 34 and the supporting section structure 37 are formed from the Si layer 43. In this case, the light reflecting section 35 and the reflection preventing film 371 are protected according to necessity. Note that the order of step 8 and step 9 is not particularly limited. For example, step 8 and step 9 may be performed in the opposite order or may be simultaneously performed.

Consequently, the structure 30 is obtained. Further, the permanent magnet 381 is provided on the lower surface of the movable section 31. The coil 382 is disposed to be opposed to the permanent magnet 381. Consequently, the optical scanner 3 is obtained.

With such a manufacturing method, since the Si layer 41 and the $SiO_2$ layer 42 are directly joined, it is possible to further increase joining strength of the Si layer 41 and the $SiO_2$ layer 42, that is, joining strength of the movable section 31 and the coupling section 36 and joining strength of the supporting section 33 and the supporting section structure 37. Therefore, it is possible to manufacture the optical scanner 3 excellent in mechanical strength.

Second Embodiment

An image display device according to a second embodiment of the invention is explained.

Figure 18:
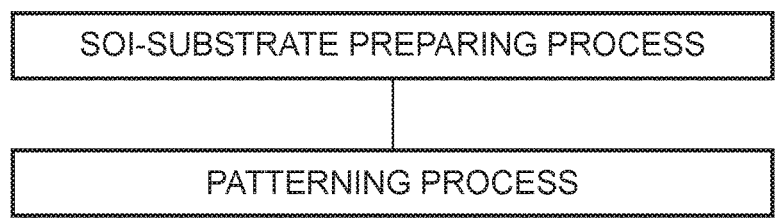
FIG. 18 is a flowchart for explaining a manufacturing method of an optical scanner according to a second embodiment of the invention.

FIG. 18 is a flowchart for explaining a manufacturing method of an optical scanner according to the second embodiment of the invention. FIGS. 19 to 24 are respectively sectional views for explaining the manufacturing method of the optical scanner.

Concerning the image display device according to the second embodiment, differences from the first embodiment are mainly explained. Explanation of similarities is omitted.

The image display device according to the second embodiment of the invention is the same as the image display device according to the first embodiment except that a manufacturing method of the optical scanner is different. Note that components same as the components in the first embodiment are denoted by the same reference numeral.

A manufacturing method of the optical scanner 3 includes, as shown in FIG. 18, an SOI-substrate preparing process and a patterning process.

SOI-substrate Preparing Process

Figure 19:
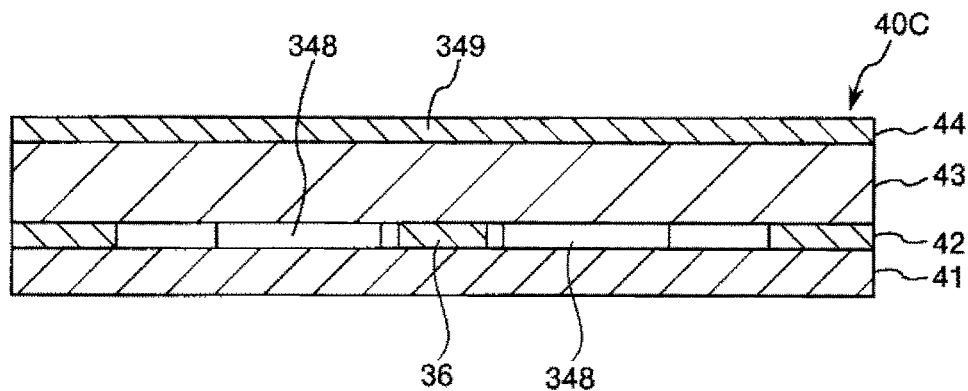
FIG. 19 is a sectional views for explaining the manufacturing method of the optical scanner.

First, as shown in FIG. 19, an SOI substrate 40C is prepared in which the Si layer 41, the $SiO_2$ layer 42, the Si layer 43, and the $SiO_2$ layer 44 are stacked in this order and the coupling section 36 and the lower layer 348 are formed in the $SiO_2$ layer 42 (step 1). An SOI substrate in which patterning (cavity processing) is applied is generally called "cavity SOI substrate" and can be manufactured by a known technique. For example, first, the Si layer 43 is prepared. Both surfaces of the Si layer 43 are thermally oxidized to form the $SiO_2$ layers 42 and 44. Subsequently, the $SiO_2$ layer 42 is patterned (subjected to cavity processing) to form the coupling section 36 and the lower layer 348 from the $SiO_2$ layer 42. Subsequently, the Si layer 41 is prepared. The surface of the Si layer 41 is activated and directly joined to the $SiO_2$ layer. Consequently, the SOI substrate 40C is obtained.

Patterning Process

Figure 20:
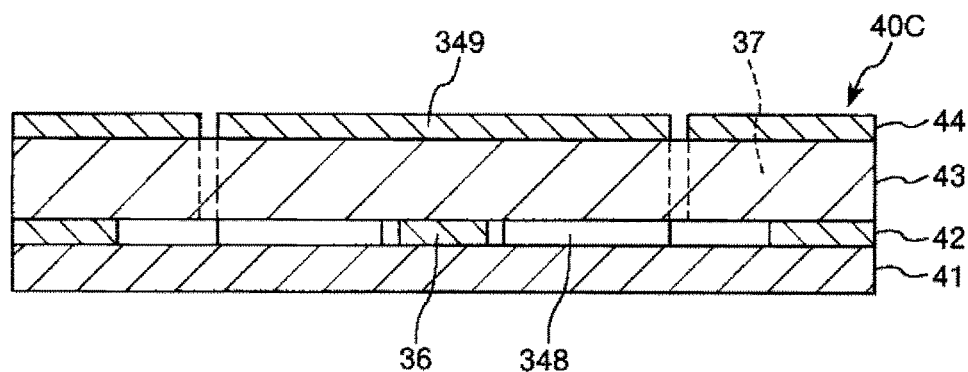
FIG. 20 is a sectional views for explaining the manufacturing method of the optical scanner.
Figure 21:
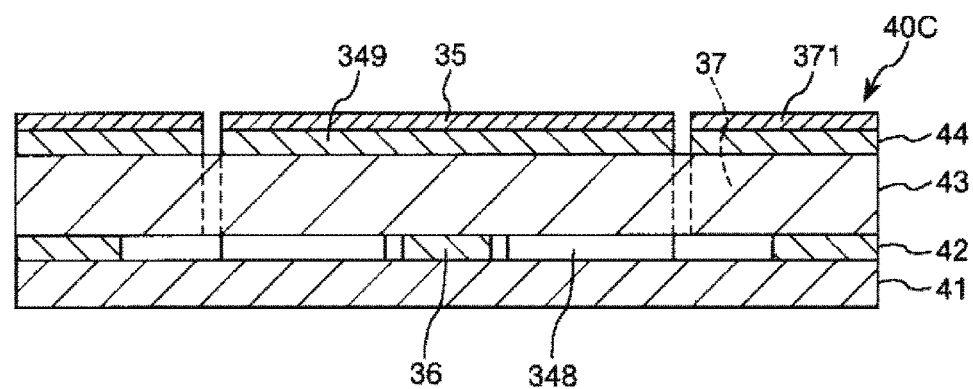
FIG. 21 is a sectional views for explaining the manufacturing method of the optical scanner.

First, as shown in FIG. 20, the $SiO_2$ layer 44 is patterned to form a part of the upper layer 349 and the supporting section structure 37 (step 2). Subsequently, an Al film is formed on the upper layer 349 (the holding section 34) to dispose the light reflecting section 35 and a Cr film is formed on the supporting section structure 37 to dispose the reflection preventing film 371 (step 3).

Figure 22:
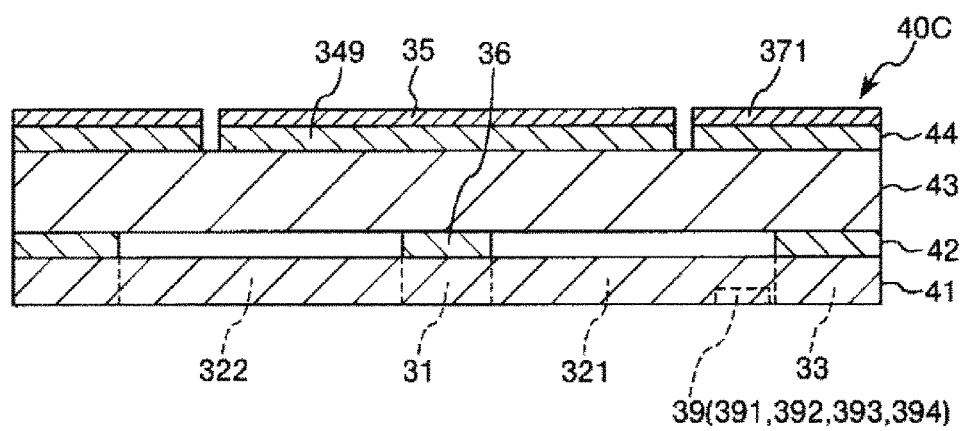
FIG. 22 is a sectional views for explaining the manufacturing method of the optical scanner.

Subsequently, as shown in FIG. 22, phosphorus, boron, or the like is doped into a portion corresponding to a connecting section of the shaft section 321 to the supporting section 33 on the lower surface of the Si layer 41 to form the piezoelectric resistance sections 391, 392, 393, and 394 and provide the sensor section 39 (step 4). Note that the order of step 4 is not particularly limited. For example, step 4may be performed earlier or later than in this embodiment.

Figure 23:
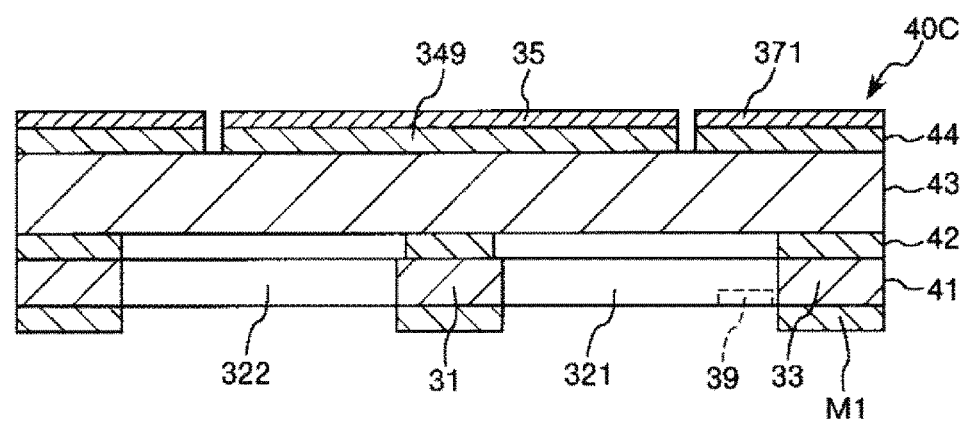
FIG. 23 is a sectional views for explaining the manufacturing method of the optical scanner.

Subsequently, as shown in FIG. 23, the masks M1 corresponding to the plan view shapes of the movable section 31, the shaft sections 321 and 322, and the supporting section 33 are formed on the lower surface of the Si layer 41. The Si layer 41 is patterned by etching via the masks M1 (i.e., from a surface opposite to a surface on which the Si layer 43 is provided) (step 5). Consequently, the movable section 31, the shaft sections 321 and 322, and the supporting section 33 are formed from the Si layer 41.

Figure 24:
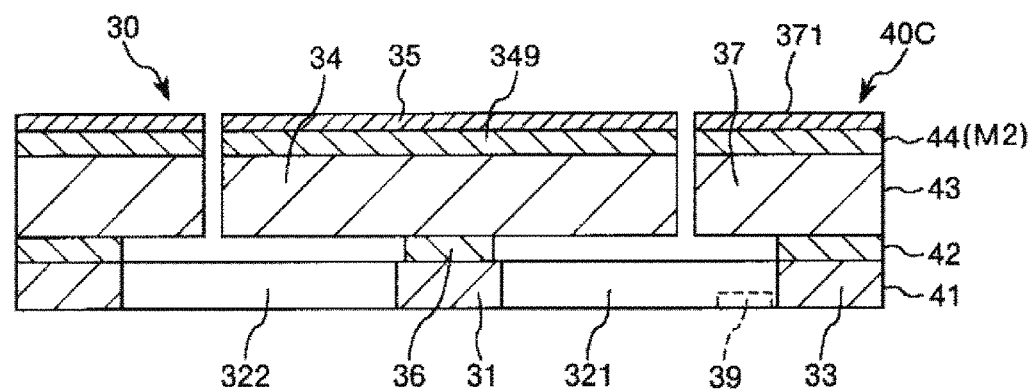
FIG. 24 is a sectional views for explaining the manufacturing method of the optical scanner.

Subsequently, as shown in FIG. 24, using the $SiO_2$ layer 44 as the mask M2, the Si layer 43 is patterned by etching via the mask M2 (step 6). Consequently, the holding section 34 and the supporting section structure 37 are formed from the Si layer 43. Note that the order of step 5 and step 6 is not particularly limited. For example, step 5 and step 6 may be performed in the opposite order or may be simultaneously performed.

Consequently, the structure 30 is obtained. Further, the permanent magnet 381 is provided on the lower surface of the movable section 31. The coil 382 is disposed to be opposed to the permanent magnet 381. Consequently, the optical scanner 3 is obtained.

With such a manufacturing method, since the Si layer 41 and the $SiO_2$ layer 42 are directly joined, it is possible to further increase joining strength of the Si layer 41 and the $SiO_2$ layer 42, that is, joining strength of the movable section 31 and the coupling section 36 and joining strength of the supporting section 33 and the supporting section structure 37. Therefore, it is possible to manufacture the optical scanner 3 excellent in mechanical strength.

According to the second embodiment, it is possible to exhibit effects same as the effects in the first embodiment explained above.

Third Embodiment

A head-up display according to a third embodiment of the invention is explained.

Figure 25:
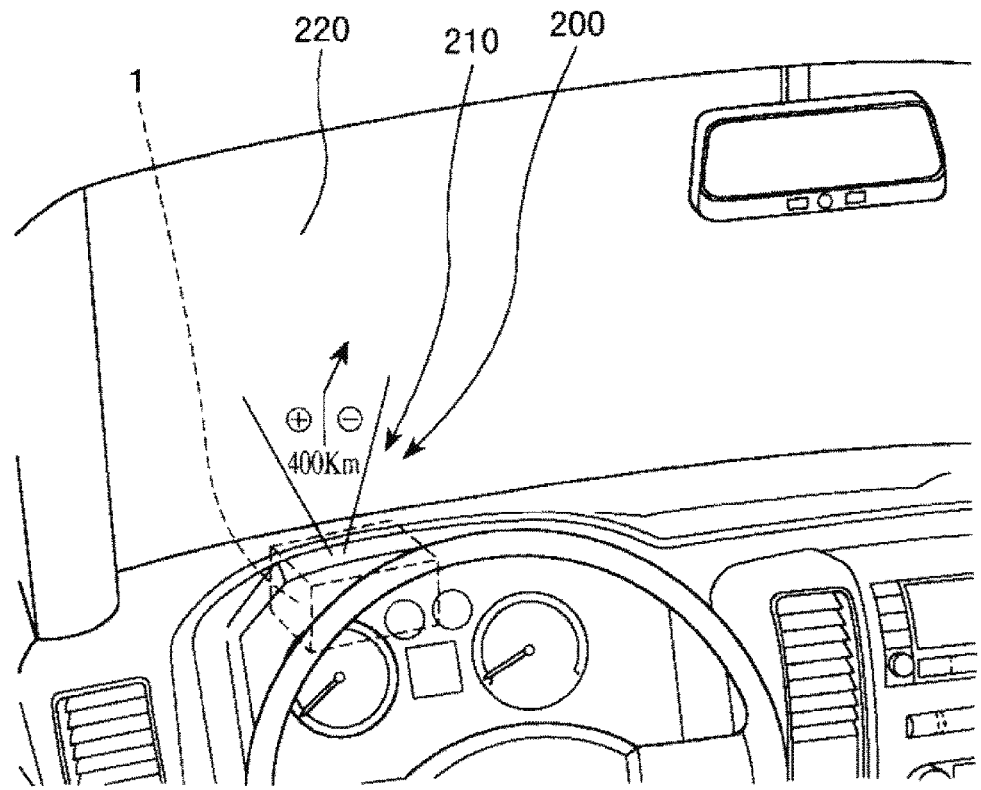
FIG. 25 is a perspective view showing a head-up display applied with an image display device according to the invention.

FIG. 25 is a perspective view showing a head-up display applied with an image display device according to the invention.

As shown in FIG. 25, in a head-up display system 200, the image display device 1 is mounted on a dashboard of an automobile to configure a head-up display 210. Predetermined images of guide display to a destination, time, orientation, speed, outdoor temperature, weather, and the like can be displayed on a windshield 220 by the head-up display 210. Note that the head-up display system 200 can be applied to not only the automobile but also an airplane, a ship, and the like.

Fourth Embodiment

A head mounted display according to a fourth embodiment of the invention is explained.

Figure 26:
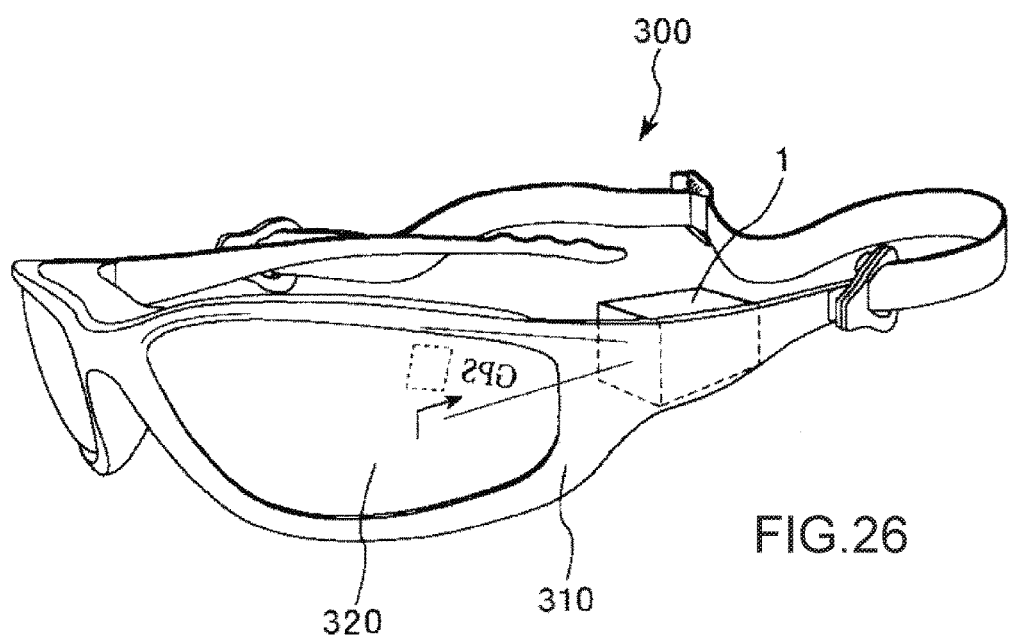
FIG. 26 is a perspective view showing a head mounted display according to the invention.

FIG. 26 is a perspective view showing a head mounted display according to the invention.

As shown in FIG. 26, a head mounted display 300 includes a frame 310 worn on the head of an observer and the image display device 1 mounted on the frame 310. A predetermined image visually recognized by one eye is displayed, by the image display device 1, on a display section (a light reflecting layer) 320 provided in a part, which is originally a lens, of the frame 310.

The display section 320 may be transparent or may be opaque. When the display section 320 is transparent, information from the image display device 1 can be superimposed on information (a scene) from the real world and used. The display section 320 only has to reflect at least a part of incident light. For example, a hologram element, a half mirror, and the like can be used in the display section 320.

The optical scanner, the manufacturing method of the optical scanner, the image display device, and the head mounted display according to the invention are explained above on the basis of the embodiments shown in the figures. However, the invention is not limited to this. The components of the sections can be replaced with any components having the same functions. Any other components may be added to the invention.

In the embodiments, the configuration capable of one-dimensionally scanning a laser (around the axis J1) is explained as the optical scanner. However, the configuration of the optical scanner is not limited to this. For example, the optical scanner may adopt a configuration formed as a so-called "gimbals type", capable of swinging around both axes of a first axis and a second axis orthogonal to the first axis, and capable of two-dimensionally scanning light.

The entire disclosure of Japanese Patent Application No. 2015-155307, filed Aug. 5, 2015 is expressly incorporated by reference herein.

What is claimed is:

1. An optical scanner comprising:
    a first Si layer;
    a first $SiO_2$ layer;
    a second Si layer,
    the first Si layer, the first $SiO_2$ layer, and the second Si layer being formed in a layer structure in which the first Si layer, the first $SiO_2$ layer, and the second Si layer are stacked in this order,
    the second Si layer including a movable section and a shaft section configured to support the movable section for swinging around a swing axis,
    the first Si layer including a holding section, and
    the first $SiO_2$ layer including a coupling section configured to couple the movable section and the holding section; and
    a light reflecting section provided on a surface side opposite to a surface of the holding section on which the coupling section is provided, the light reflecting section reflecting light, wherein
    the movable section and the coupling section are joined by direct joining.

2. The optical scanner according to claim 1, wherein the holding section overlaps at least a part of the shaft section in a plan view from the plate thickness direction of the movable section.

3. The optical scanner according to claim 1, further comprising a first portion provided on the surface of the holding section on which the coupling section is provided, the first portion being formed from the first $SiO_2$ layer, wherein
    the first portion includes a groove section in a region overlapping the shaft section in a plan view from the plate thickness direction of the movable section.

4. The optical scanner according to claim 1, further comprising:
    a second $SiO_2$ layer provided on an opposite side of a surface of the first Si layer on which the first $SiO_2$ layer is provided; and
    a second portion provided between the holding section and the light reflecting section and formed from the second $SiO_2$ layer.

5. The optical scanner according to claim 1, further comprising a supporting section formed from the second Si layer and configured to support the shaft section.

6. The optical scanner according to claim 1, further comprising a supporting section structure formed from the first Si layer, provided to surround at least a part of the holding section in a plan view from the plate thickness direction of the holding section, and joined to the supporting section.

7. The optical scanner according to claim 6, wherein a reflection reducing film that reduces reflection of the light is provided on a surface on an opposite side of a surface of the supporting section structure on which the supporting section is provided.

8. The optical scanner according to claim 7, wherein a clearance between the holding section and the supporting section structure is smaller than a clearance between the movable section and the supporting section.

9. A manufacturing method of an optical scanner including a movable section, a shaft section configured to support the movable section for swinging around a swing axis, a holding section disposed to be separated from the movable section in a thickness direction of the movable section, a coupling section located between the movable section and the holding section and configured to couple the movable section and the holding section, and a light reflecting section provided on a surface side opposite to a surface of the holding section on which the movable section is provided, the light reflecting section reflecting light, the manufacturing method comprising:

preparing a first substrate on which a first Si layer and a first $SiO_2$ layer are stacked and forming the coupling section from the first $SiO_2$ layer;

preparing a second substrate including a second Si layer and directly joining the coupling section of the first substrate and the second Si layer of the second substrate;

patterning, from a surface side opposite to a surface on which the first substrate is provided, the second Si layer to form the movable section and the shaft section;

patterning, from a surface side opposite to a surface on which the second substrate is provided, the first Si layer to form the holding section; and disposing the light reflecting section in the holding section.

10. The manufacturing method of the optical scanner according to claim 9, wherein the first substrate includes a second $SiO_2$ layer provided on a surface on an opposite side of a surface of the first Si layer on which the first $SiO_2$ layer is provided, and the forming the holding section includes patterning the first Si layer via a mask formed from the second $SiO_2$ layer.

11. A manufacturing method of an optical scanner including a movable section, a shaft section configured to support the movable section for swinging around a swing axis, a holding section disposed to be separated from the movable section in a thickness direction of the movable section, a coupling section located between the movable section and the holding section and configured to couple the movable section and the holding section, and a light reflecting section provided on an opposite side of a surface of the holding section on which the coupling section is provided, the light reflecting section reflecting light, the manufacturing method comprising:

preparing an SOI substrate including a first Si layer, a second Si layer, and a first $SiO_2$ layer provided between the first Si layer and the second Si layer, the coupling section being formed from the first $SiO_2$ layer;

patterning, from a surface side opposite to a surface on which the first Si layer is provided, the second Si layer to form the movable section and the shaft section;

patterning, from a surface side opposite to a surface on which the second Si layer is provided, the first Si layer to form the holding section; and disposing the light reflecting section in the holding section.

12. An image display device comprising the optical scanner according to claim 1.

13. An image display device comprising the optical scanner according to claim 2.

14. An image display device comprising the optical scanner according to claim 3.

15. An image display device comprising the optical scanner according to claim 4.

16. An image display device comprising the optical scanner according to claim 5.

17. A head mounted display comprising:

the optical scanner according to claim 1; and a frame mounted with the optical scanner and worn on a head of an observer.

18. A head mounted display comprising:

the optical scanner according to claim 2; and a frame mounted with the optical scanner and worn on a head of an observer.

19. A head mounted display comprising:

the optical scanner according to claim 3; and a frame mounted with the optical scanner and worn on a head of an observer.

20. A head mounted display comprising:

the optical scanner according to claim 4; and a frame mounted with the optical scanner and worn on a head of an observer.

* * * * *